(12) United States Patent
Huang et al.

(10) Patent No.: US 6,391,757 B1
(45) Date of Patent: May 21, 2002

(54) DUAL DAMASCENE PROCESS

(75) Inventors: I-Hsiung Huang, Kao-Hsiung; Jiunn-Ren Hwang, Tai-Chiung; Yeong-Song Yen, Taipei Hsien; Ching-Hsu Chang, Yun Lin Hsien, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/875,508

(22) Filed: Jun. 6, 2001

(51) Int. Cl.[7] ...................... H01L 21/44; H01L 21/4763
(52) U.S. Cl. .................. 438/597; 438/624; 438/638; 438/700; 438/738
(58) Field of Search .................... 438/597, 624, 438/638, 700, 622, 740, 738, 633, 634, 703, 785, 782; 757/767, 758, 761, 736

(56) References Cited

U.S. PATENT DOCUMENTS

| 5,741,626 | A | * | 4/1998 | Jain et al. ...................... 216/18 |
| 5,887,076 | A | * | 3/1999 | Dai ............................. 438/597 |
| 5,935,762 | A | * | 8/1999 | Dai et al. .................... 430/312 |
| 6,004,188 | A | * | 12/1999 | Roy ............................. 451/41 |
| 6,103,456 | A | * | 8/2000 | Tobben et al. ............... 430/314 |
| 6,184,128 | B1 | * | 2/2001 | Wang et al. ................. 438/624 |
| 6,235,628 | B1 | * | 5/2001 | Wang et al. ................. 438/622 |
| 6,294,836 | B1 | * | 9/2001 | Paranjpe et al. ............ 257/758 |
| 6,323,123 | B1 | * | 11/2001 | Liu et al. .................... 438/638 |
| 2001/0008802 | A1 | * | 7/2001 | Nishizawa ................... 438/694 |
| 2001/0027003 | A1 | * | 10/2001 | Rangarajan et al. ........ 438/586 |
| 2001/0045656 | A1 | * | 11/2001 | Yokoyama ................... 257/758 |

* cited by examiner

Primary Examiner—Michael S. Lebentritt
(74) Attorney, Agent, or Firm—Winston Hsu

(57) ABSTRACT

A dual damascene process involves forming a first passivation layer, a first dielectric layer and a second passivation layer on a substrate of a semiconductor wafer. A first lithography and etching process is performed to form at least one via hole in the second passivation layer and the first dielectric layer. Thereafter, a second dielectric layer and a third passivation layer are formed on the surface of the semiconductor wafer followed by performing a second lithography and etching process to form at least one trench in the third passivation layer and the second dielectric layer. The trench and the via hole together construct a dual damascene structure. Finally, a barrier layer and a metal layer are formed on the surface of the semiconductor wafer, and a chemical-mechanical-polishing (CMP) process is performed to complete the dual damascene process.

12 Claims, 5 Drawing Sheets

DUAL DAMASCENE PROCESS

BACKGROUND OF THE INVENTION

1. Field of the Invention

The present invention relates to a dual damascene process, and more particularly, to a dual damascene process that combines low-K materials and Cu.

2. Description of the Prior Art

To satisfy requirements for high integration and high speed in integrated circuits (ICs), especially in a deep sub-micro (<0.18 μm) semiconductor process, a Cu dual damascene process is now becoming a more widely used and a standard process in forming an interconnection line within the inter-metal dielectric layer of low dielectric constant (low k) materials. Since Copper has both a low resistance and a low electromigration resistance, the low k materials are useful in improving the RC delay effect of a metal interconnection.

Please refer to FIG. 1 of a cross-sectional diagram of a semiconductor wafer 10 with a typical dual damascene structure 11. As shown in FIG. 1, the dual damascene structure 11 formed within a dielectric layer 20 is composed of a via 22 and a trench 23. A conductive layer 14 is formed in the dielectric layer 12 beneath the via 22, and a Cu conductive layer 24 fills the trench 23. The Cu conductive layer 24 and the conductive layer 14 are connected by a via plug 22a penetrating through the passivation layer 18 between the dielectric layer 12 and the dielectric layer 20.

To prevent a diffusion of Cu from the dual damascene structure 11 into the adjacent dielectric layer 20, a barrier layer 25 is needed on a surface of the dual damascene structure 11 according to the prior art. Commonly, the barrier layer 25 comprises the following properties: (1) good exclusion of the diffusing atoms, (2) good adhesion to Cu and the dielectric layer, (3) proper resistance (<1000 $\mu\Omega$-cm), and (4) good step coverage. Usually Ti, TiN, TaN, WN, etc. are used to form the barrier layer.

However, failure such as a via open normally occurs in the prior Cu dual damascene process. Cu diffuses from the cracks in the barrier layer 25 into the dielectric layer 20, which results in a disconnection problem between the Cu conductive layer 24 and the conductive layer 14. The situation is worsened when the dielectric layer 20 is composed of a low k material with a high thermal expansion coefficient, such as a SiLK™ or a porous structure material. In a dual damascene process of a SILK™ dielectric layer 20 and a TaN barrier layer 25, the thermal expansion coefficients of the SILK™, Cu and TaN are 60 ppm/°C., 17 ppm/°C. and 3 ppm/°C., respectively. The TaN barrier layer 25 with the least thermal expansion coefficient is subject to a thermal stress produced from the SiLK™ dielectric layer 20, thus producing cracking. As a result, via failure is induced.

SUMMARY OF THE INVENTION

It is therefore a primary objective of the present invention to provide a dual damascene process to solve the above-mentioned problems.

In a preferred embodiment of the present invention, the dual damascene process first provides a semiconductor wafer comprising a substrate and a conductive layer positioned on the substrate. A first passivation layer, a first dielectric layer and a second passivation layer are respectively formed on the substrate of the semiconductor wafer. Following that, a first lithography and etching process is performed to form at least one via hole in the second passivation layer and the first dielectric layer. Thereafter, a second dielectric layer and a third passivation layer are respectively formed on the surface of the semiconductor wafer with the second dielectric layer filling the via hole. A second lithography and etching process is then performed to form at least one trench in the third passivation layer and the second dielectric layer. The trench and the via hole together construct a dual damascene structure. Finally, a barrier layer and a metal layer are respectively formed on the surface of the semiconductor wafer with the metal layer filling the dual damascene structure, and a chemical-mechanical-polishing (CMP) process is performed to complete the dual damascene process.

The present invention uses a hard dielectric material to form a via hole of the dual damascene structure and uses a low-K material to form a trench of the dual damascene structure. Therefore, the dual damascene structure has enough compression resistance to avoid structure deformation and a via open issue, and also produces a low RC delay effect.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
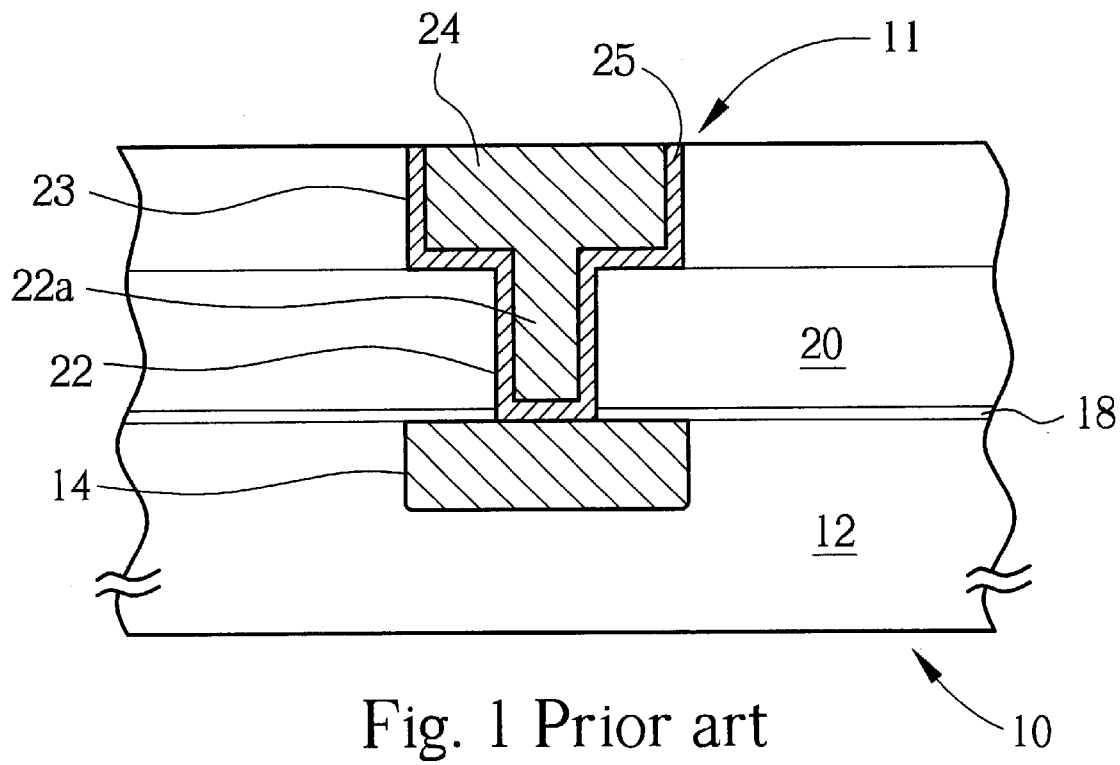
FIG. 1 is a cross-sectional diagram of a dual damascene interconnection structure according to the prior art.
Figure 2:
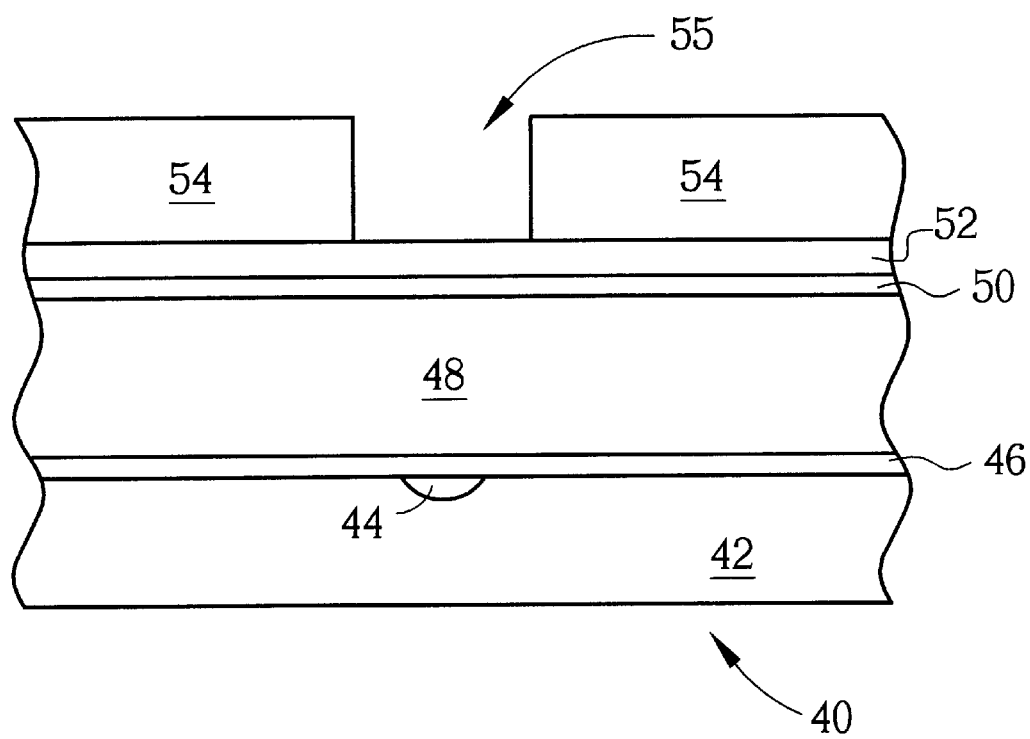
FIG. 2 to FIG. 9 are schematic diagrams of a dual damascene process according to the present invention.

Please refer to FIG. 2 to FIG. 9 of schematic diagrams of a dual damascene process according to the present invention. As shown in FIG. 2, the process comprises first providing a semiconductor wafer 40 comprising a substrate 42 and a conductive layer 44 composed of a copper conductor and positioned on the substrate 42. A first passivation layer 46, a first dielectric layer 48, a second passivation layer 50 and a first anti-reflection layer 52 are respectively formed on the surface of the semiconductor wafer 40 and covering the conductive layer 44. The first passivation layer 46 and second 50 passivation layer are both composed of silicon nitride, silicon-oxy-nitride, or silicon carbon, and the first anti-reflecting layer 52 is composed of silicon-oxy-nitride. Then a first lithography process is performed to form a first photoresist layer 54 on the surface of the first anti-reflecting layer 52 to define pattern of a via hole 55 of the dual damascene structure.

Figure 3:
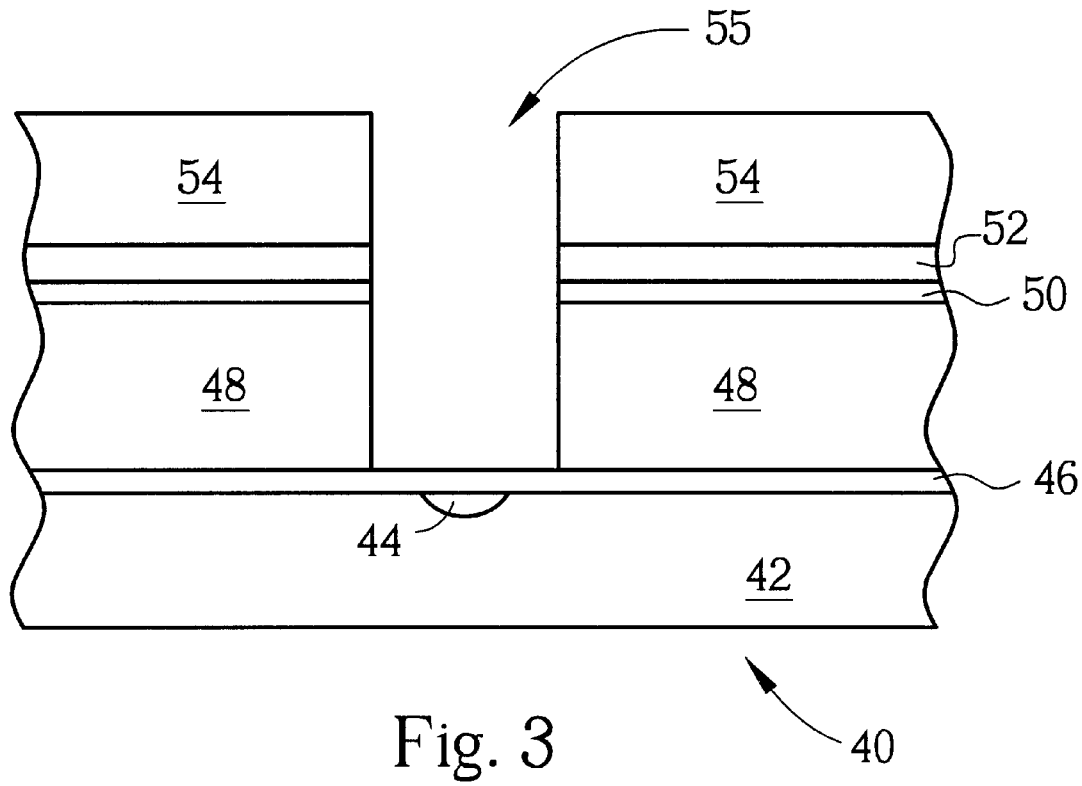
Figure 4:
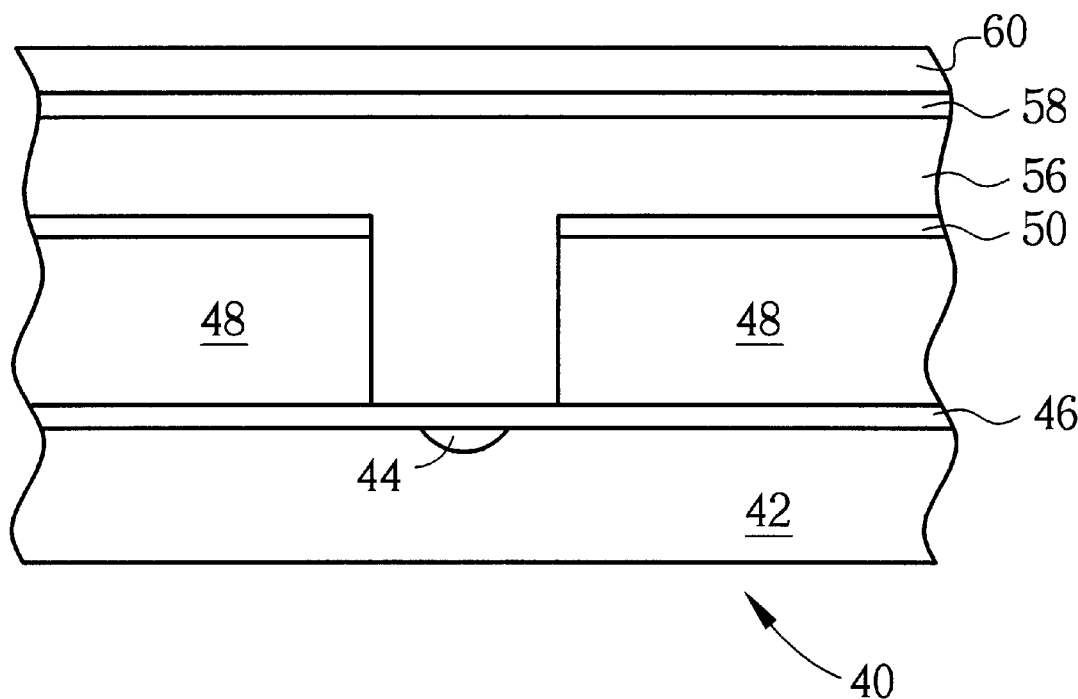

As shown in FIG. 3, a first etching process is performed according to the pattern of the first photoresist layer 54 to remove the first anti-reflecting layer 52, the second passivation layer 50 and the first dielectric layer 48 not covered by the pattern of first photoresist layer 54 to a surface of the first passivation layer 46 so as to form at least one via hole 55 in the second passivation layer 50 and the first dielectric layer 48. Thereafter, the first photoresist layer 54 and the first anti-reflecting layer 52 are removed followed by forming a second dielectric layer 56, a third passivation layer 58 and a second anti-reflecting layer 60 respectively on a surface of the semiconductor wafer 40 with the second dielectric layer 56 filling the via hole 55, as shown in FIG. 4.

Figure 5:
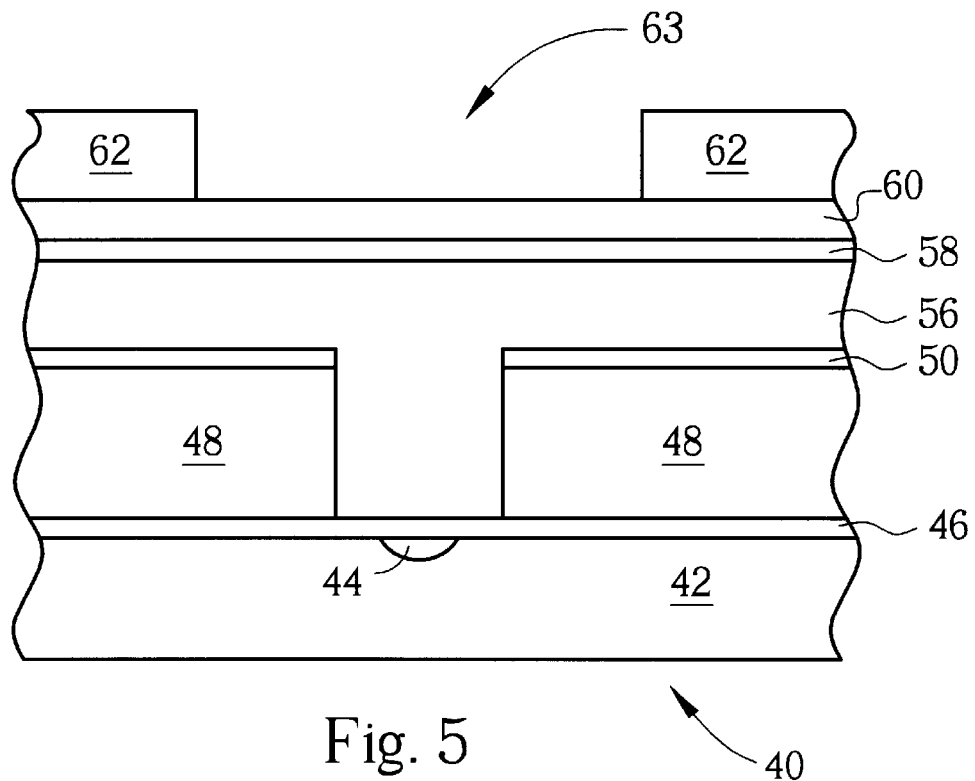
Figure 6:
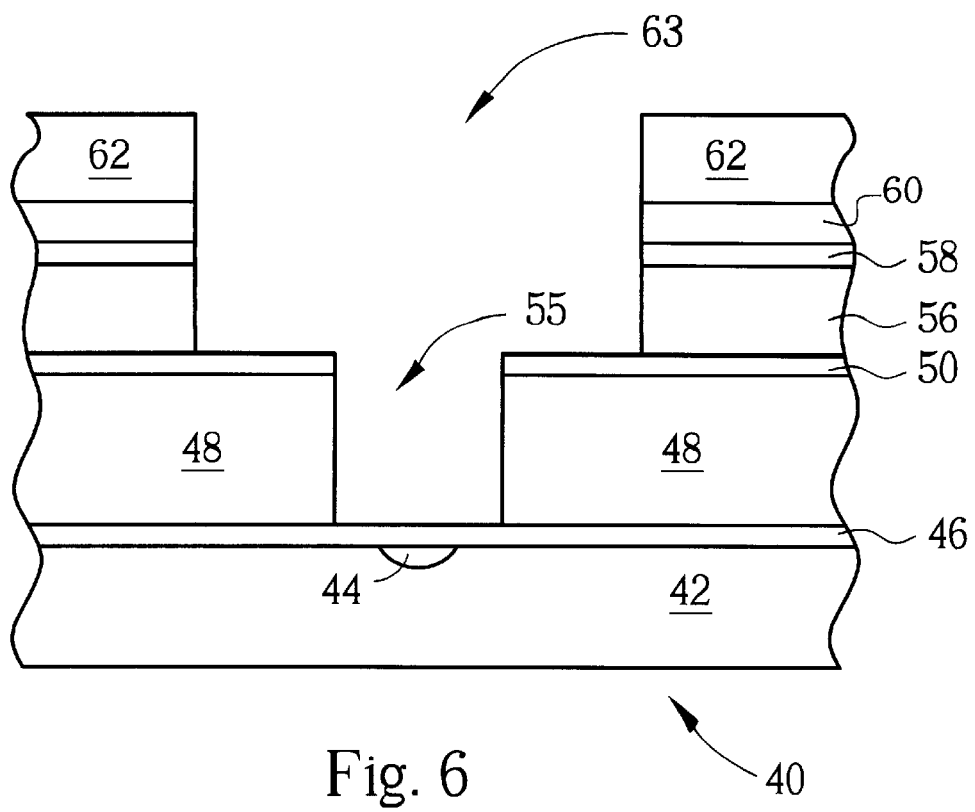

Then as shown in FIG. 5, a second lithography process is performed to form a second photoresist layer 62 on the second anti-reflecting layer 60 to define a pattern of an upper trench 63 of the dual damascene structure. Following that, as shown in FIG. 6, a second etching process is performed according to a pattern of the second photoresist layer 62 to remove the second anti-reflecting layer 60, the third passivation layer 58 and the second dielectric layer 56 not covered by the pattern of the second photoresist layer 62 to the surface of the first passivation layer 46 so as to form at least one trench 63 in the third passivation layer 58 and the second dielectric layer 56. The trench 63 and the via hole 55 together construct a dual damascene structure.

Figure 7:
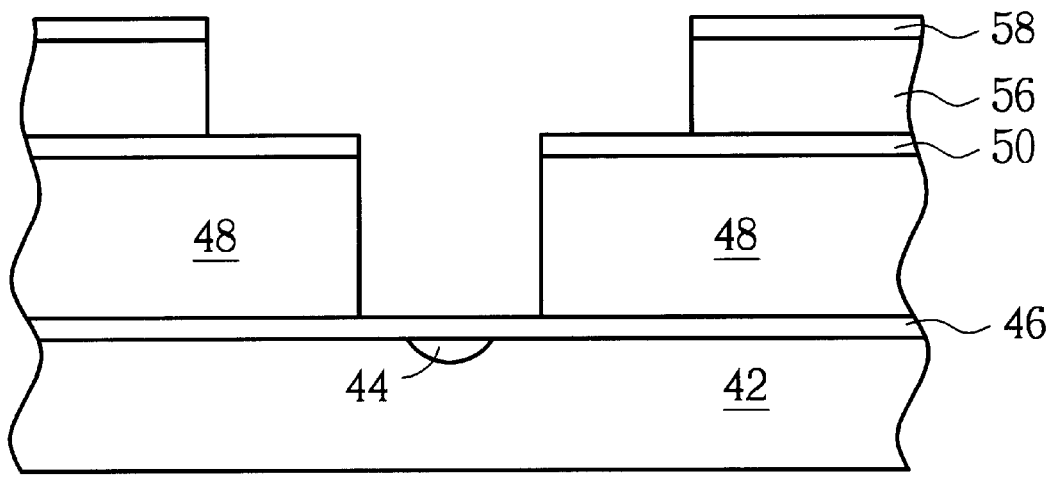
Figure 8:
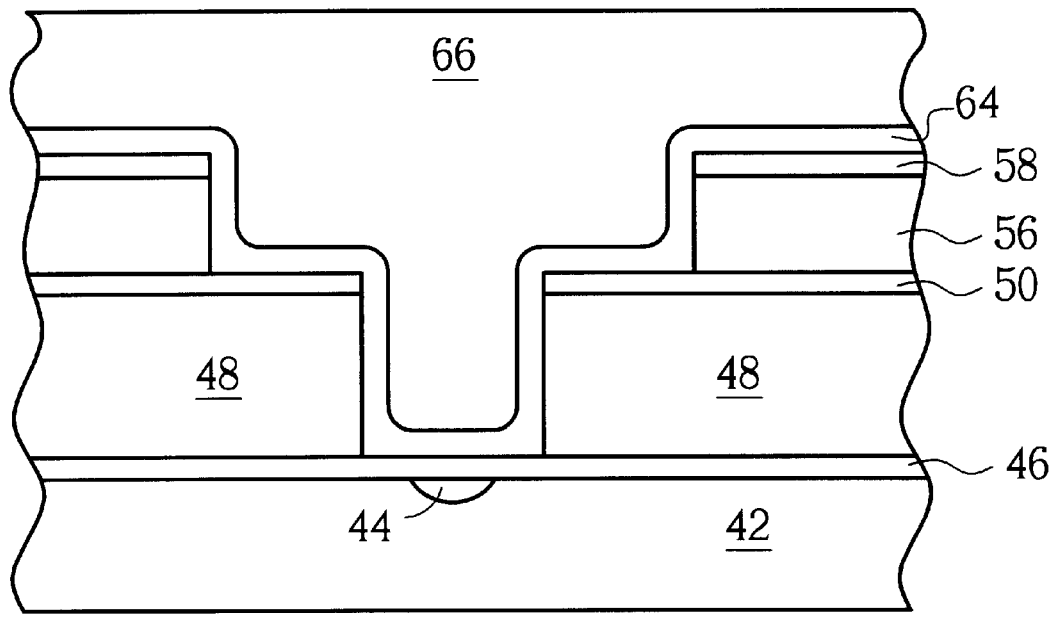

As shown in FIG. 7, the second photoresist layer 62 and the second anti-reflecting layer 60 are removed followed by performing a third etching process to remove the second passivation layer 50 and the first passivation layer 46 not covered by the pattern of the second dielectric layer 56 and the pattern of the first dielectric layer 48. Then as shown in FIG. 8, a barrier layer 64 and a metal layer 66 are respectively formed on the surface of the semiconductor wafer 40 with the metal layer 66 filling the dual damascene structure.

Figure 9:
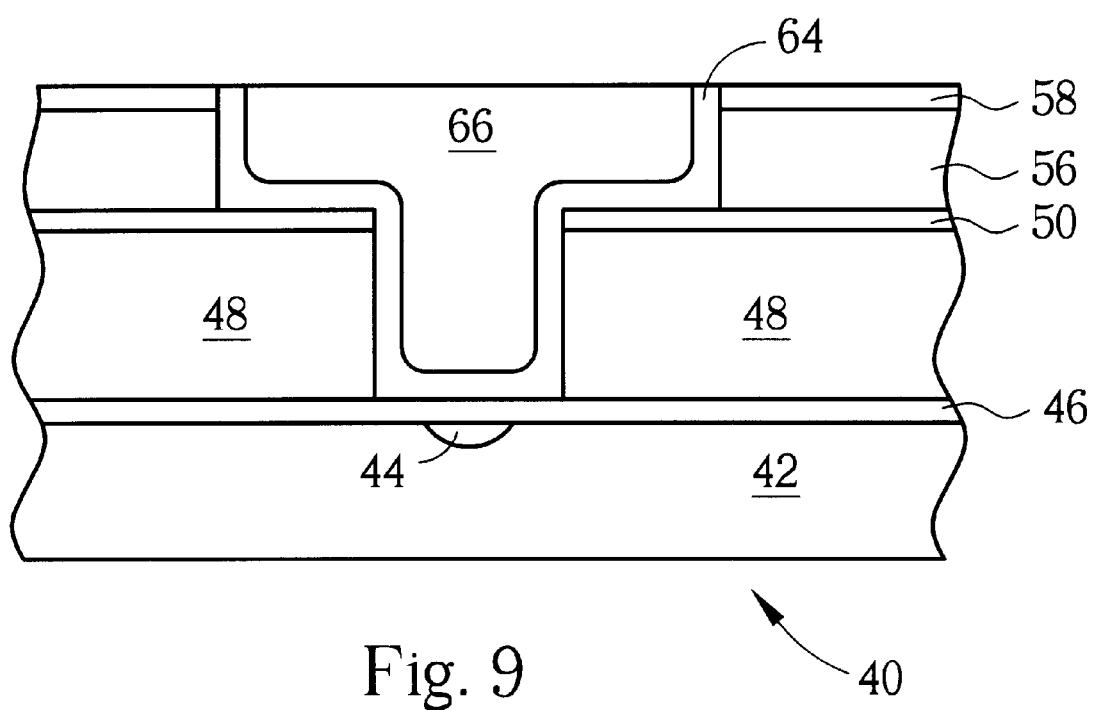

Finally as shown in FIG. 9, a forth etching process is performed to remove the barrier layer 64 on the bottom surface of the dual damascene structure. Then a chemical mechanical polishing (CMP) process using the third passivation layer 58 as a stop layer is performed to remove portions of the metal layer 66 and the barrier layer 64 so completing the dual damascene process.

In the above-mentioned embodiment of fabricating a dual damascene structure according to the present invention, the first dielectric layer is composed of fluorinated silicate glass (FSG) or undoped silicate glass (USG), which is rigid and has good compression resistance. The second dielectric layer is composed of low-K materials such as FLARE™, SiLK™, poly(arylene ether) polymer, parylene compounds, polyimide, fluorinated polyimide, hydrogen silsesquioxane (HSQ), fluorinated silicon glass (FSG), silicon dioxide, nanoporous silica, or teflon, which assists in reducing the RC delay effect.

In contrast of the prior dual damascene process, the dual damascene structure fabricated by the present invention is composed of hybrid dielectric materials. Therefore, the dual damascene structure has enough compression resistance to avoid structure deformation and a via open issue, and simultaneously reducing the RC delay effect.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A dual damascene process comprising:

providing a semiconductor wafer which comprises a substrate and a conductive layer positioned on the substrate;

forming a first passivation layer, a first dielectric layer, a second passivation layer and a first anti-reflection layer respectively on the semiconductor wafer and covering the conductive layer;

performing a first lithography process to form a first photoresist layer on the first anti-reflecting layer to define a pattern of a via hole of the dual damascene structure;

performing a first etching process according to a pattern of the first photoresist layer to remove the first anti-reflecting layer, the second passivation layer and the first dielectric layer not covered by the pattern of the first photoresist layer to a surface of the first passivation layer so as to form at least one via hole in the second passivation layer and the first dielectric layer;

removing the first photoresist layer and the first anti-reflecting layer;

forming a second dielectric layer, a third passivation layer and a second anti-reflecting layer respectively on a surface of the semiconductor wafer, and the second dielectric layer filling the via hole;

performing a second lithography process to form a second photoresist layer on the second anti-reflecting layer to define a pattern of an upper trench of the dual damascene structure;

performing a second etching process according to a pattern of the second photoresist layer to remove the second anti-reflecting layer, the third passivation layer and the second dielectric layer not covered by the pattern of the second photoresist layer to the surface of the first passivation layer so as to form at least one trench in the third passivation layer and the second dielectric layer, the trench and the via hole together forming a dual damascene structure;

removing the second photoresist layer and the second anti-reflecting layer;

performing a third etching process to remove the second passivation layer and the first passivation layer not covered by the pattern of the second dielectric layer and the pattern of the first dielectric layer;

forming a barrier layer and a metal layer respectively on the surface of the semiconductor wafer and the metal layer filling the dual damascene structure; and performing a chemical mechanical polishing (CMP) process which uses the third passivation layer as a stop layer to remove portions of the metal layer and the barrier layer so completing the dual damascene process.

2. The method of claim 1 wherein the conductive layer is a copper conductor.

3. The method of claim 1 wherein each passivation layer is composed of silicon nitride, silicon-oxy-nitride, or silicon carbon.

4. The method of claim 1 wherein each anti-reflecting layer is composed of silicon-oxy-nitride, and the second passivation layer and the third passivation layer are both composed of silicon nitride or silicon carbon.

5. The method of claim 1 wherein the first dielectric layer or the second dielectric layer is composed of a low-K material.

6. The method of claim 5 wherein the low-K material comprises a material consistent with parameters of FLARE, a material consistent with parameters of SiLK, poly(arylene ether) polymer, parylene compounds, polyimide, fluorinated polyimide, hydrogen silsesquioxane (HSQ), fluorinated silicon glass (FSG), silicon dioxide, nanoporous silica or teflon.

7. The method of claim 1 wherein the first dielectric layer is composed of fluorinated silicate glass (FSG) or undoped silicate glass (USG), and the second dielectric layer is composed of a material consistent with parameters of SiLK.

8. The method of claim 1 wherein a forth etching process is utilized to remove the barrier layer on a bottom surface of the dual damascene structure.

9. A dual damascene process comprising:

providing a semiconductor wafer which comprises a substrate and a conductive layer positioned on the substrate;

forming an inorganic dielectric layer and a first anti-reflection layer respectively on the semiconductor wafer and covering the conductive layer;

performing a first lithography process to form a first photoresist layer on the first anti-reflecting layer to define a pattern of a via hole of the dual damascene structure;

performing a first etching process according to the pattern of the first photoresist layer to remove the first anti-reflecting layer and the inorganic dielectric layer not covered by the pattern of the first photoresist layer to a surface of the conductive layer so as to form at least one via hole in the inorganic dielectric layer;

removing the first photoresist layer and the first anti-reflecting layer;

forming an organic dielectric layer and a second anti-reflecting layer respectively on the surface of the semiconductor wafer, and the organic dielectric layer filling the via hole;

performing a second lithography process to form a second photoresist layer on the second anti-reflecting layer to define a pattern of an upper trench of the dual damascene structure;

performing a second etching process according to the pattern of the second photoresist layer to remove the second anti-reflecting layer and the organic dielectric layer not covered by the pattern of the second photoresist layer until the surface of the conductive layer so as to form at least one trench in the organic dielectric layer, the trench and the via hole together forming a dual damascene structure;

removing the second photoresist layer and the second anti-reflecting layer;

forming a barrier layer and a metal layer respectively on the surface of the semiconductor wafer and the metal layer filling the dual damascene structure; and performing a chemical mechanical polishing (CMP) process which uses the organic dielectric layer as a stop layer to remove portions of the metal layer and the barrier layer so completing the dual damascene process.

10. The method of claim 9 wherein the conductive layer is a copper conductor.

11. The method of claim 9 wherein each anti-reflecting layer is composed of silicon-oxy-nitride.

12. The method of claim 9 wherein the inorganic dielectric layer is composed of fluorinated silicate glass (FSG) or undoped silicate glass (USG), and the organic dielectric layer is composed of a material consistent with parameters of SiLK.

* * * * *